(12) United States Patent
Okajima et al.

(10) Patent No.: US 10,923,366 B2
(45) Date of Patent: Feb. 16, 2021

(54) SUBSTRATE PROCESSING APPARATUS AND METHOD OF MANUFACTURING SEMICONDUCTOR DEVICE

(71) Applicant: KOKUSAI ELECTRIC CORPORATION, Tokyo (JP)

(72) Inventors: Yusaku Okajima, Toyama (JP); Shuhei Saido, Toyama (JP); Hidenari Yoshida, Toyama (JP); Takafumi Sasaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/549,492

(22) Filed: Aug. 23, 2019

(65) Prior Publication Data
US 2020/0066551 A1 Feb. 27, 2020

(30) Foreign Application Priority Data
Aug. 27, 2018 (JP) ................. 2018-158159

(51) Int. Cl.
*H01L 21/67* (2006.01)
(52) U.S. Cl.
CPC .. *H01L 21/67017* (2013.01); *H01L 21/67109* (2013.01); *H01L 21/67126* (2013.01); *H01L 21/67236* (2013.01)
(58) Field of Classification Search
None
See application file for complete search history.

(56) References Cited

U.S. PATENT DOCUMENTS

| | | | |
|---|---|---|---|
| 5,484,484 A | 1/1996 | Yamaga et al. |
| 6,902,624 B2 | 6/2005 | Seidel et al. |
| 8,057,599 B2 | 11/2011 | Ozaki et al. |
| 9,934,960 B2 | 4/2018 | Horita et al. |
| 2015/0227602 A1 | 8/2015 | Ramu et al. |
| 2017/0037512 A1 | 2/2017 | Saido et al. |

(Continued)

FOREIGN PATENT DOCUMENTS

| CN | 1701417 A | 11/2005 |
|---|---|---|
| JP | 3093716 B2 | 10/2000 |

(Continued)

OTHER PUBLICATIONS

Taiwanese Office Action dated Aug. 14, 2020 for Taiwanese Patent Application No. 108124109.

*Primary Examiner* — Jack S Chen
(74) *Attorney, Agent, or Firm* — Volpe Koenig

(57) ABSTRACT

There is provided a technique that includes a substrate processing apparatus, comprising a process chamber having a cylindrical space configured to accommodate a substrate; and a plurality of nozzles communicating with a gas supply pipe and discharging processing gas in the process chamber, the process chamber includes a cylindrical reaction tube; a cylindrical manifold; and a lid, the lid includes a protection plate; and an introduction hole, the manifold includes a protection liner on an inner face of the manifold such that a second gap is formed between the manifold and the protection liner, the first gap being formed to allow the purge gas flowing toward the manifold to be deflected by the inner face of the manifold and to flow into the second gap.

12 Claims, 9 Drawing Sheets

(56) References Cited

U.S. PATENT DOCUMENTS

| | | | |
|---|---|---|---|
| 2017/0088948 A1 | 3/2017 | Takagi et al. | |
| 2017/0294318 A1 | 10/2017 | Yoshida et al. | |
| 2017/0335452 A1 | 11/2017 | Yamazaki et al. | |
| 2018/0033645 A1 | 2/2018 | Saido et al. | |
| 2020/0066551 A1* | 2/2020 | Okajima | H01L 21/67109 |

FOREIGN PATENT DOCUMENTS

| | | |
|---|---|---|
| JP | 2016-009724 A | 1/2016 |
| JP | 6146886 B2 | 6/2017 |
| TW | 201703143 A | 1/2017 |
| TW | 201820526 A | 6/2018 |
| WO | 2019/044013 A1 | 3/2019 |

* cited by examiner

SUBSTRATE PROCESSING APPARATUS AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2018-158159, filed on Aug. 27, 2018, the entire contents of which are incorporated herein by reference.

TECHNICAL FIELD

The present disclosure relates to a substrate processing apparatus that performs processing such as formation of a thin film on a substrate, and a method of manufacturing a semiconductor device using the substrate processing apparatus.

BACKGROUND

As a substrate processing apparatus that performs substrate processing in a process of manufacturing a semiconductor device, there is a vertical substrate processing apparatus. In the vertical substrate processing apparatus, a plurality of substrates are loaded into a process chamber and processed at once, in a state that the plurality of substrates are arranged and held in multiple stages.

Recently, the demand for high-temperature process using precursor gas which is difficult to be decomposed is increasing. When the high-temperature process is performed, since a furnace opening in the lower portion of the process chamber also becomes high temperature, the heat resistance temperature of a seal member, such as an O-ring or the like, installed in the furnace opening may be exceeded. Therefore, the seal member is maintained within a heat resistance temperature range by installing a cooling channel in the furnace opening and circulating cooling water in the cooling channel.

On the other hand, when the temperature of the furnace opening is lowered, reaction byproduct of diffused precursor gas is adhered to the furnace opening, which causes generation of particles. Conventionally, as means for suppressing the adhesion of the reaction byproduct to the furnace opening, a heater may be installed in the furnace opening. However, a temperature drop near the cooling channel cannot be avoided, and it is difficult to avoid the adhesion of the reaction byproduct near the cooling channel.

In addition, conventionally, there is also a method of installing a guide parallel to the inner surface of the furnace opening in a lid which opens and closes the furnace opening. In this method, the adhesion of the reaction byproduct to the furnace opening is suppressed by supplying purge gas to a guide and allowing the purge gas to flow through the inner surface of the furnace opening. In this method, however, in order to prevent damage to the guide due to contact with the furnace opening, it is necessary to have a gap of a predetermined size, e.g., about 4 mm, between the guide and the inner surface of the furnace opening, and it is difficult to obtain a sufficient effect.

SUMMARY

The present disclosure provides some embodiments of a substrate processing apparatus capable of suppressing adhesion of byproduct of precursor gas to a furnace opening, and a method of manufacturing a semiconductor device.

According to one embodiment of the present disclosure, there is provided a technique that includes a substrate processing apparatus, comprising: a process chamber having a cylindrical space configured to accommodate a plurality of substrates in a state that the plurality of substrates are arranged at predetermined intervals along a predetermined axis; and a plurality of nozzles, each of which communicating with a gas supply pipe and discharging processing gas in the process chamber, wherein the process chamber includes: a cylindrical reaction tube having an open end; a cylindrical manifold connected to the open end of the reaction tube and having a side surface that is configured to introduce the processing gas from the gas supply pipe into the process chamber; and a lid configured to open and close an opening at an end of the manifold, which is opposite to another end of the manifold that is connected to the reaction tube, wherein the lid includes: a protection plate installed on an inner surface of the lid such that a first gap is formed between the lid and the protection plate; and an introduction hole configured to introduce purge gas from an outer side of the lid into the first gap, and wherein the manifold includes a protection liner on an inner wall of the manifold such that a second gap is formed between the manifold and the protection liner, the first gap and second gap are decoupled physically, coupleded fluidically and allow the purge gas flowing from the first gap to be deflected by the inner wall of the manifold and to flow into the second gap.

DETAILED DESCRIPTION

Figure 1:
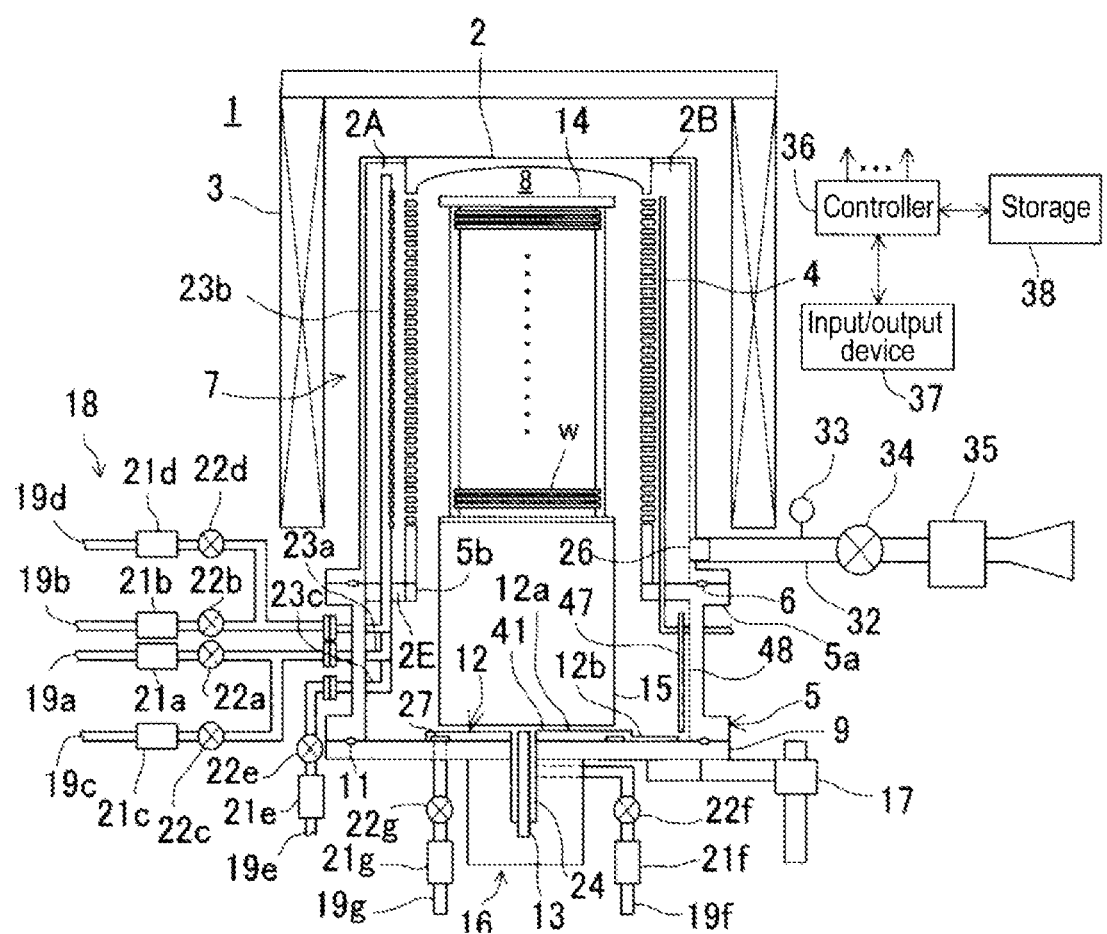
FIG. 1 is a vertical cross sectional view illustrating a substrate processing apparatus according to a first embodiment of the present disclosure.

Embodiments of the present disclosure will now be described with reference to the drawings. In the following drawings, like or corresponding components are denoted by like or corresponding reference numerals and a description thereof will be omitted.

In a first embodiment of the present disclosure, a substrate processing apparatus is configured as a vertical substrate processing apparatus (hereinafter, referred to as a "processing apparatus") 1 which performs substrate processing such as heat treatment, which is one of manufacturing processes in a method of manufacturing a semiconductor device.

As illustrated in FIG. 1, the processing apparatus 1 includes a cylindrical reaction tube 2 and a heater 3 as a heating means (heating mechanism) installed on an outer circumference of the reaction tube 2. The reaction tube 2 is made of, e.g., synthetic quartz (SiO2), silicon carbide (SiC) or the like. A temperature detector 4 is installed in the reaction tube 2. The temperature detector 4 is erected along the inner wall of the reaction tube 2.

A circular manifold 5 is connected to a lower end opening of the reaction tube 2 through a seal member 6 such as an O-ring or the like, and supports the lower end of the reaction tube 2. The manifold 5 is made of metal e.g., stainless steel or the like. A process container 7 is formed by the reaction tube 2 and the manifold 5. A process chamber 8 in which wafers W as substrates are processed is formed in the process container 7.

In addition, a supply buffer chamber 2A and an exhaust buffer chamber 2B are formed to face each other in the reaction tube 2 so as to protrude in the outer peripheral direction (radial direction). The supply buffer chamber 2A is partitioned into a plurality of spaces by partition walls vertically extending. A nozzle 23a, a nozzle 23b, and a nozzle 23c (which will be described later) are respectively installed in the respective spaces of the supply buffer chamber 2A. A lateral width (radial direction of the reaction tube 2) of the supply buffer chamber 2A may be set as small as possible within a range in which these nozzles 23 can be safely installed. On the other hand, a lateral width of the exhaust buffer chamber 2B may be set equal to or larger than the lateral width of the supply buffer chamber 2A in order to increase the exhaust speed. The exhaust buffer chamber 2B having the largest lateral width shows a shape of a double cylindrical tube by connecting both sides of the exhaust buffer chamber 2B with both sides of the supply buffer chamber 2A. A boundary wall between the supply buffer chamber 2A and the exhaust buffer chamber 2B and the process chamber 8 is formed to have an inner diameter equal to an inner diameter of the reaction tube 2 at a position in which the supply buffer chamber 2A or the like is not installed, therefore the periphery of the substrates is surrounded by a concentric wall and the substrates. A plurality of slits 2C and 2D are installed in the boundary wall in order to allow both sides of the plurality of slits 2C and 2D to communicate with each other. An opening 2E for inserting and removing the nozzle 23a, the nozzle 23b, and the nozzle 23c is formed at the lower end of the supply buffer chamber 2A. The opening 2E is formed to have the substantially same width as the width of the supply buffer chamber 2A. Furthermore, since it is difficult to eliminate a gap between the opening 2E and the bases of the nozzle 23a, the nozzle 23b and the nozzle 23c regardless of the shape of the opening 2E, gas can flow in and out of the supply buffer chamber 2A through the gap.

An outer flange 5a protruding in the outer peripheral direction and an inner flange 5b protruding in the inner peripheral direction are formed at an upper end of the manifold 5. The outer flange 5a supports the reaction tube 2 (including outer walls of the supply buffer chamber 2A and the exhaust buffer chamber 2B) as an outer tube. The inner flange 5b supports inner walls of the supply buffer chamber 2A and the exhaust buffer chamber 2B as (a part of) an inner tube, and a portion corresponding to the opening 2E is notched. The inner flange 5b may be welded to the manifold 5 to enhance heat conduction which will be described later.

Furthermore, a lower end opening of the manifold 5 (a lower end opening of the process container 7) is opened and closed by a disc-shaped lid (door) 9. The lid 9 is made of, e.g., metal. A seal member 11 such as an O-ring or the like is installed on an upper surface of the lid 9 such that the reaction tube 2 and outside air are hermetically sealed by the seal member 11. A disc-shaped protection plate 12 as a lid cover as described later is installed on the upper surface of the lid 9. A hole is formed at the center of the lid 9 so that a rotary shaft 13 as described later is inserted through the hole. For protection of the seal member 6 and the seal member 11, the seal member 6 and the seal member 11 may be kept at a predetermined heat resistance temperature (e.g., 200 degrees C.) or lower, and a cooling channel 25 (see FIG. 3) for keeping the seal member 6 and the seal member 11 at the heat resistance temperature or lower may be formed in the outer flange 5a.

The process chamber 8 accommodates a boat 14 inside, the boat 14 serving as a substrate support which vertically supports a plurality of wafers W, e.g., 25 to 150 wafers, in a shelf shape. The boat 14 is made of, e.g., quartz, SiC or the like, and is supported above a heat insulating structure (heat insulating CAP) 15. The substrate support is configured by the boat 14 and the heat insulating structure 15.

An outer shape of the heat insulating structure 15 is cylindrical, and the heat insulating structure 15 is supported by the rotary shaft 13 penetrating the lid 9. The rotary shaft 13 is connected to a rotation mechanism 16 installed below the lid 9. For example, a magnetic fluid seal is installed in a portion where the rotary shaft 13 penetrates the lid 9, and the rotary shaft 13 is configured to be rotatable in a state in which the interior of the reaction tube 2 is hermetically sealed. The heat insulating structure 15 and the boat 14 are integrally rotated by rotating the rotary shaft 13. The lid 9 is driven up and down by a boat elevator 17 which is an elevator. The substrate support and the lid 9 are integrally moved up and down by the boat elevator 17 so that the boat 14 is loaded into and unloaded from the reaction tube 2.

The processing apparatus 1 has a gas supply mechanism 18 for supplying precursor gas, reaction gas, or inert gas as processing gas used for processing substrate into the process chamber 8. The processing gas supplied by the gas supply mechanism 18 is selected depending on a type of a film to be formed. In the first embodiment, the gas supply mechanism 18 includes a precursor gas supplier, a reaction gas supplier, an inert gas supplier, a first purge gas supplier, and a second purge gas supplier.

The precursor gas supplier includes a gas supply pipe 19a. A mass flow controller (MFC) 21a, which is a flow rate controller (flow rate control part), and a valve 22a, which is an opening and closing valve, are installed in the gas supply pipe 19a sequentially from the upstream side of the gas supply pipe 19a. A downstream end of the gas supply pipe 19a is connected to the nozzle 23a penetrating a sidewall of the manifold 5. The nozzle 23a is vertically erected along the inner wall of the reaction tube 2 in the reaction tube 2, and a plurality of supply holes opened toward the wafers W supported by the boat 14 are formed in the nozzle 23a. The precursor gas is supplied to the wafers W through the supply holes of the nozzle 23a.

By the same configuration, the reaction gas is supplied from the reaction gas supplier to the wafers W via a gas supply pipe 19b, an MFC 21b, a valve 22b, and the nozzle 23b. The inert gas is supplied from the inert gas supplier to the wafers W via gas supply pipes 19c, 19d and 19e, MFCs 21c, 21d and 21e, valves 22c, 22d and 22e, and nozzles 23a, 23b and 23c.

The first purge gas supplier includes a gas supply pipe 19f. An MFC 21f and a valve 22f are installed in the gas supply pipe 19f sequentially from the upstream side of the gas supply pipe 19f. A downstream end of the gas supply pipe 19f is connected to a hollow portion 24 formed around the rotary shaft 13. The hollow portion 24 is sealed in front of a bearing by a magnetic fluid seal and is opened to its upper end, i.e., the inside of the reaction tube 2. In addition, a space is formed to communicate between the hollow portion 24 and the upper surface of the protection plate 12, and the space is continuous with a gap 41 (see FIG. 2) formed between the heat insulating structure 15 and the protection plate 12 to form a first purge gas flow path. With such configuration, first purge gas 28 is supplied from the first purge gas supplier to the lower side of the process container 7 which is the furnace opening while purging the gap 41. That is, the first purge gas 28 purges the periphery of the rotary shaft 13 at the upstream side and purges the vicinity of the nozzles 23a to 23c in the furnace opening at the downstream side, and is then finally discharged from an exhaust port 26 formed at the lower end of the reaction tube 2. The purge gas may be any gas that does not react with the precursor gas or the reaction gas.

The second purge gas supplier includes a gas supply pipe 19g. An MFC 21g and a valve 22g are installed in the gas supply pipe 19g sequentially from the upstream side of the gas supply pipe 19g. A downstream end of the gas supply pipe 19g penetrates the lid 9, and a second purge gas supply port is formed on the upper surface of the lid 9. Therefore, the second purge gas supply port is formed on the upper surface of the lid 9 and is opened in a second purge gas flow path 27. An opening position of the second purge gas supply port is near the nozzles 23a, 23b, and 23c. A flexible pipe such as a bellows pipe is used for the gas supply pipe 19a between the valve 22g and the second purge gas supply port. The second purge gas flow path 27 is annular or substantially annular (loop-like), and is concentrically formed on the lower surface of the protection plate 12.

An exhaust pipe 32 is installed in the exhaust port 26 formed laterally on the outer wall of the exhaust buffer chamber 2B. A vacuum pump 35 as a vacuum exhaust device is connected to the exhaust pipe 32 via a pressure sensor 33 as a pressure detector (pressure detection part) which detects the internal pressure of the process chamber 8 and an auto pressure controller (APC) valve 34 as a pressure regulator (pressure regulation part). With this configuration, the internal pressure of the process chamber 8 can be set at a processing pressure required for processing. The exhaust pipe 32 is installed at a position facing the nozzles 23a, 23b and 23c.

A controller 36 is connected to and configured to control the rotation mechanism 16, the boat elevator 17, and the MFCs 21a to 21g, the valves 22a to 22g and the APC valve 34 of the gas supply mechanism 18. The controller 36 includes, for example, a microprocessor (computer) including a CPU, and is configured to control operations of the processing apparatus 1. An input/output device 37 configured as, e.g., a touch panel or the like, is connected to the controller 36.

A storage 38 as a storage medium is connected to the controller 36. A control program for controlling operations of the processing apparatus 1, and a program (also referred to as a "recipe") for causing each component of the processing apparatus 1 to execute processing according to processing conditions is readably stored in the storage 38. The storage 38 may be a storage device (a hard disk or a flash memory) incorporated in the controller 36, or may be a portable external recording device (a magnetic tape, a magnetic disk such as a flexible disk or a hard disk, an optical disc such a CD, a DVD or the like, a magneto-optical disc such as an MO, or a semiconductor memory such as a USB memory or a memory card. Furthermore, the program may be supplied to the computer using a communication means such as internet or a dedicated line. The program is read from the storage 38 according to an instruction from the input/output device 37 as necessary. The controller 36 executes processing according to the read recipe so that the processing apparatus 1 executes desired processing under the control of the controller 36.

The protection plate 12 installed on the upper surface of the lid 9 is made of a heat and corrosion resistant material (made of a corrosion resistant material) e.g., quartz or the like. When the protection plate 12 covers the lid 9 made of metal, the contact of the processing gas with the lid 9 is suppressed and the corrosion or deterioration of the lid 9 due to the processing gas are suppressed.

Figure 2:
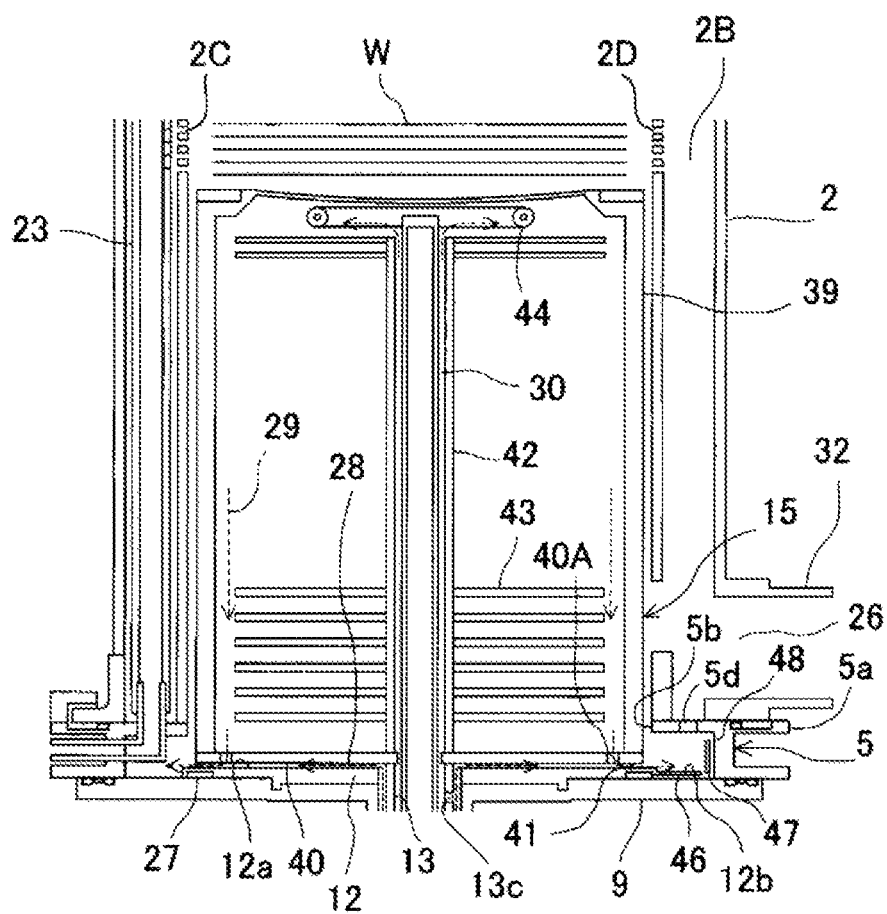
FIG. 2 is a vertical cross sectional view illustrating a furnace opening of the substrate processing apparatus.

FIG. 2 illustrates an internal structure of the furnace opening and the heat insulating structure 15. The heat insulating structure 15 has a cylindrical body 39 and a metal disc-shaped bottom plate 40 supported by the rotary shaft 13. The cylindrical body 39 is made of a heat resistant material e.g., quartz or the like, has a hollow structure with its lower end opened, and is mounted on the bottom plate 40. In addition, a hollow cylindrical insulating plate support column 42 is installed on the bottom plate 40 in the cylindrical body 39. In FIG. 2, the nozzles 23a to 23c will be generally referred to as a nozzle 23.

The heat insulating plate support column 42 is configured to support disc-shaped heat insulating plates 43 made of a heat resistant material e.g., quartz or the like, and laminated in multiple stages. A sub heater 44 is insertedly penetrated into the heat insulating plate support column 42. The sub heater 44 has a ring shape above the heat insulating plate support column 42, and is configured to heat the upper surface of the cylindrical body 39 and the lower portion of the process chamber 8 by the sub heater 44. In order to insertedly penetrate the sub heater 44, the rotary shaft 13 also has a hollow structure, and third purge gas 29 branched from the first purge gas 28 is introduced into the rotary shaft 13 from a through hole 13c installed in a side portion near the lower end of the rotary shaft 13.

The first purge gas 28 supplied from the first purge gas supplier flows up through the outer circumference of the rotary shaft 13, changes the course horizontally, purges the narrow gap 41 between the bottom plate 40 and the protection plate 12, and is supplied to the lower portion of the process container 7 which is the furnace opening. That is, the first purge gas 28 purges the periphery of the rotary shaft 13 at the upstream side, and purges the exposed surface of the protection plate 12 or the base of the nozzles 23a to 23c at the downstream side, and is then finally discharged from the exhaust port 26 formed adjacent to the lower end of the reaction tube 2.

The protection plate 12 extends to the vicinity of the manifold 5 except for portions in which the nozzles 23a, 23b and 23c are disposed. The protection plate 12 has a central portion 12a located closer to a central side of the protection plate 12 than the second purge gas flow path 27, and an outer circumferential portion 12b located closer to an outer circumferential side of the protection plate 12 than the second purge gas flow path 27. A lower surface of the central portion 12a makes contact with the upper surface of the lid 9, and a gap 46 as a first gap having a predetermined interval is formed between the lower surface of the outer circumferential portion 12b and the upper surface of the lid 9. Furthermore, a distance between the outer circumferential end of the outer circumferential portion 12b and the inner wall (inner face) of the manifold 5 is set to, e.g., about 5 to 8 mm.

In addition, a protection liner 47 vertically extending along the inner wall of the manifold 5 is installed in the manifold 5. The protection liner 47 is made of a heat and corrosion resistant material e.g., quartz or the like, and has the shape of open ring and a thickness of about 1.5 to 3 mm. A gap 48 as a second gap having a predetermined interval, e.g., 1 to 2 mm, is formed between the protection liner 47 and the inner wall of the manifold 5. A guide of second purge gas 49 (see FIG. 3) is configured by the protection plate 12 (the outer circumferential portion 12b) and the protection liner 47.

The second purge gas 49 supplied to the second purge gas flow path 27 flows radially outward from the second purge gas flow path 27 through the gap 46, and purges the upper surface of the lid 9. In addition, the second purge gas 49 passing through the gap 46 flows straight along the upper surface of the lid 9 and is then vertically deflected by the inner wall of the manifold 5 to flow through the gap 48 and purge the inner wall of the manifold 5. The second purge gas 49 passing through the gap 48 joins the first purge gas 28, passes through a vent hole 5d formed in the inner flange 5b, and is exhausted from the exhaust port 26. The second purge gas flow path 27, the gap 46, and the gap 48 may be generally referred to as the second purge gas flow path. Furthermore, the sum of the flow rates of the first purge gas 28 and the second purge gas 49 may be set at a flow rate that does not affect film-formation on the wafers W in some embodiments.

The third purge gas 29 branched from the first purge gas 28 in the hollow portion 24 is introduced into the heat insulating structure 15 through a gap between the rotary shaft 13 and the sub heater 44 and a gap between the heat insulating plate support column 42 and the sub heater 44. These gaps constitute a third purge gas flow path 30. In addition, a plurality of openings 40A are formed in the bottom plate 40, for example, at equal angular pitches, as discharge holes for the third purge gas.

The third purge gas 29 is supplied from the upper end of the heat insulating plate support column 42 into the cylindrical body 39 via the third purge gas flow path 30. The third purge gas 29 in the cylindrical body 39 descends along the inner circumferential surface of the cylindrical body 39, is discharged from the opening 40A, joins the first purge gas 28, and is discharged into the furnace opening. In the process of discharging the third purge gas 29 into the furnace opening, the interior of the cylindrical body 39 is purged. The conductance of each flow path is designed such that the flow rate of the third purge gas 29 is larger than the flow rate of the first purge gas 28. The purge gas may be any gas that does not react with the precursor gas or the reaction gas.

Figure 3:
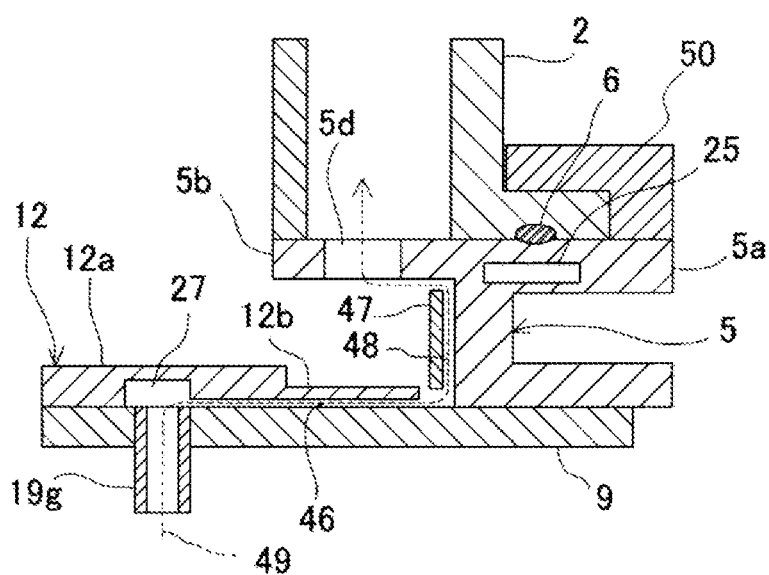
FIG. 3 is a vertical cross sectional illustrating a guide and peripheral portions of the furnace opening.
Figure 4:
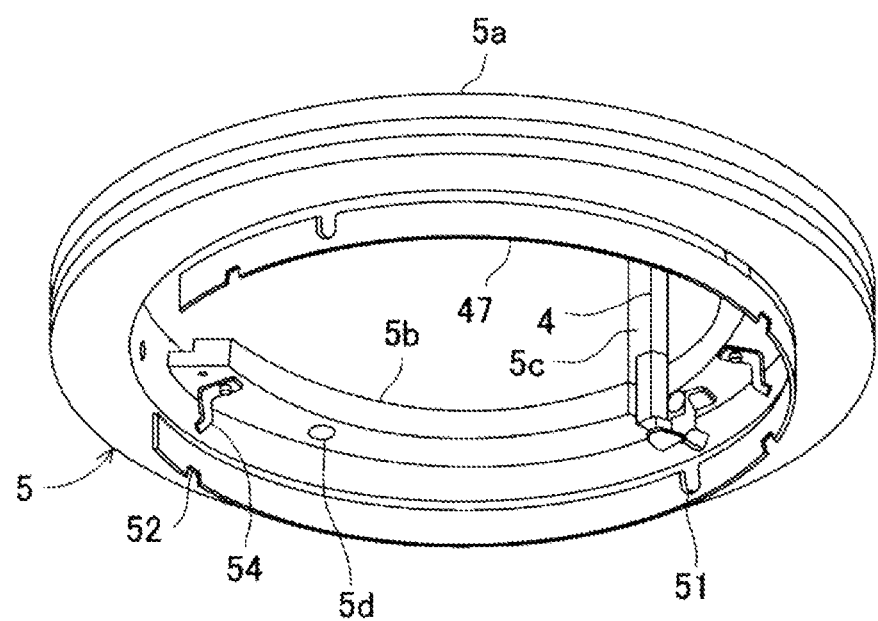
FIG. 4 is a perspective view illustrating the furnace opening.

Next, details of the guide and its peripheral portions will be described with reference to FIGS. 3 to 5. FIG. 4 illustrates a state where the protection liner 47 is removed from the furnace opening.

The protection liner 47 has a substantially cylindrical shape except for the portions in which the nozzles 23a, 23b, 23c are disposed. That is, the protection liner 47 has an opened cylindrical shape with a C-shaped cross section.

A predetermined number of notches 51 are formed at predetermined positions at the upper end of the protection liner 47. The notches 51 are installed at positions corresponding to members which penetrate the sidewall of the manifold 5, such as the temperature detector 4, the nozzle 23 or the like. When the protection liner 47 is installed in the furnace opening, the contact between each member and the protection liner 47 is prevented by the notches 51. In addition, engaging recesses 52 are formed at at least three points, for example, at four points in FIG. 4, at the lower end of the protection liner 47.

The inner flange 5b has a relatively small thickness at a connection position with the inner wall of the manifold 5. The inner flange 5b receives heat in a furnace and easily reaches a high temperature of 300 degrees C. or higher, and thus, heat transfer is properly suppressed by such thin portion. Furthermore, in the inner flange 5b, a notch 5c is formed in a portion corresponding to a member extending and protruding along the inner wall of the manifold 5 and the reaction tube 2, such as the temperature detector 4 or the like, and the notch 5c is configured so that each member and the inner flange 5b do not make contact with each other. In addition, a vent hole 5d for exhausting the second purge gas 49 to the exhaust port 26 is formed in the inner flange 5b. When the exhaust buffer chamber 2B has a sufficiently large width, a plurality of additional vent holes 5d for exhausting gas through the exhaust buffer chamber 2B may be formed at predetermined angular pitches. Protection liner fixtures 54 are installed at at least three points on the lower surface of the inner flange 5b, the at least three points corresponding to the engaging recesses 52.

A seal member 6 is installed on the upper surface of the outer flange 5a. A clamp 50 presses the flange of the reaction tube 2 toward the upper surface of the outer flange 5a. The cooling channel 25 is formed in the outer flange 5a to suppress the temperature rise of the seal member 6 and maintain a temperature of the seal member 6 at a heat resistance temperature (e.g., 280 degrees C.) or lower. The cooling channel 25 may be installed at a position which can maintain the seal member 6 at a predetermined temperature or lower, that is lower than the heat resistance temperature, and in which the temperature of the inner wall of the manifold 5 can be set at a predetermined temperature (e.g., 330 degrees C.) or higher that can suppress adhesion of reaction byproduct. In the case of the present embodiment, the inner flange 5b is connected to a portion near an upper end of the inner wall of the manifold 5, which is near the cooling channel 25 (which is a portion in which the temperature is lowered by the cooling channel 25). At this connection point, heat from the inner flange 5b is conducted by being divided into the outer flange 5a and the inner wall of the manifold 5 which is thicker (i.e., smaller in thermal resistance) than the outer flange 5a. Much of the heat transferred to the outer flange 5a is discarded to the cooling channel 25 before being transferred to the seal member 6, and at the same time the heat transferred to the inner wall contributes to raising the temperature of the inner surface of the inner wall. The cooling channel 25 is installed, for example, at a position closer to the seal member 6 as viewed from the connection point. If the seal member 6 can be sufficiently cooled, the cooling channel 25 may be installed in the clamp 50.

Figure 5:
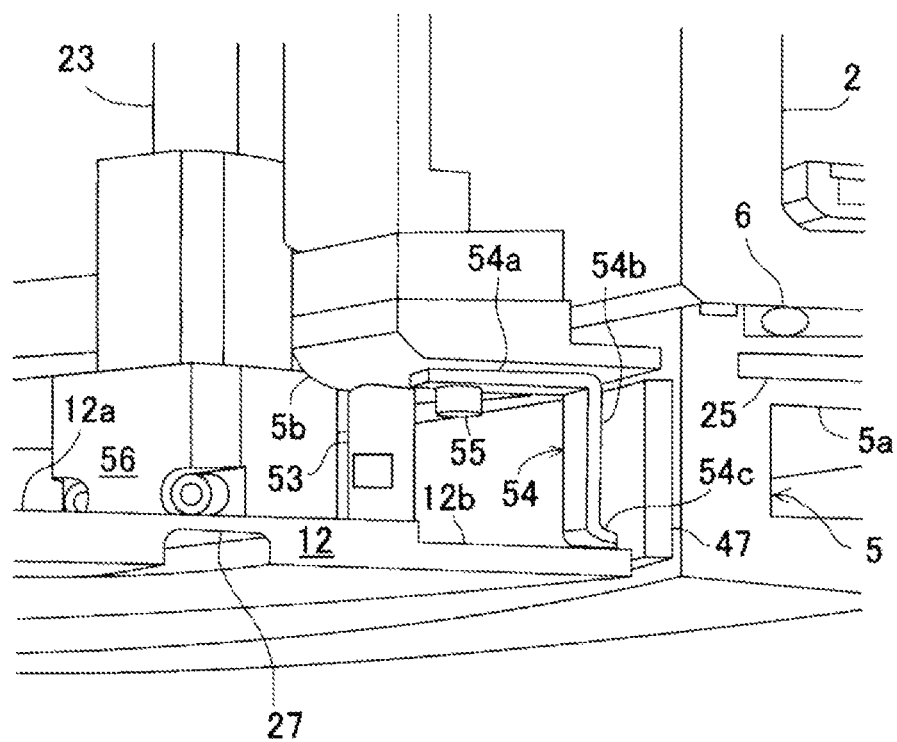
FIG. 5 is a cross sectional perspective view illustrating the guide and the peripheral portions of the furnace opening.

As in FIG. 5, a base 56 of the nozzle 23 is formed as a box-shaped elbow made of metal and is installed in the nozzle port of the manifold 5. The height of the manifold may be set at a minimum height that can accommodate the base 56, and is set, for example, larger than the height of the elbow portion and smaller than twice the height of the elbow portion, in some embodiments. A rod-shaped nozzle auxiliary fixture 53 made of a nickel alloy is installed at both sides of the notch corresponding to the opening 2E of the inner flange 5b. An upper end of the nozzle auxiliary fixture 53 is fixed to the lower surface of the inner flange 5b by a necessary means such as screwing or the like. Furthermore, the vertical load of the base 56 can be received by a flat plate (not shown) transferred to the lower end of the nozzle auxiliary fixture 53, or the inclination of the base 56 can be prevented by the flat plate.

The protection liner fixtures 54 are each configured by a fixing portion 54a parallel to the lower surface of the inner flange 5b, an extension/protrusion portion 54b extending downward from the outer circumferential end of the fixture 54a along the inner wall of the manifold 5, and an engaging portion 54c which protrudes from a lower end of the extension/protrusion portion 54b in an outer peripheral direction. Furthermore, the protection liner fixtures 54 are made of an elastic material, e.g., stainless steel having a thickness of 0.5 mm or less, and the fixing portion 54a is fixed to the lower surface of the inner flange 5b by a screw 55 so that the fixing portion 54a and the engaging portion 54c extend in the radial direction. The engaging portion 54c is engageable with each of the engaging recesses 52, and the protection liner 47 is supported by the protection liner fixture 54 by engagement of the engaging portion 54c and the engaging recess 52. In addition, when the engaging portion 54c and the engaging recess 52 are engaged, the extension/protrusion portion 54b can press the protection liner 47 radially outward by making contact with the protection liner 47.

Since the protection liner fixture 54 is made of an elastic material, the engaging portion 54c moves forward and backward in the radial direction by bending the protection liner fixture 54. When the protection liner 47 is installed, the protection liner 47 is inserted into the furnace opening so as to cover the periphery of the protection liner fixture 54 while the engaging portion 54c is moved radially inward. In this state, when the position of the engaging portion 54c is returned, the engaging portion 54c protrudes radially outward beyond the inner diameter of the protection liner 47, so that the engaging portion 54c engages with the engaging recess 52.

When the engaging portion 54c and the engaging recess 52 are engaged, the protection liner 47 is pressed radially outward by a restoring force of the protection liner fixture 54. Since the protection liner fixtures 54 are installed at at least three points, a position of the protection liner 47 in the radial direction is determined by the balance of the restoring force. Therefore, the protection liner 47 is supported to be substantially concentric with the manifold 5, and the width of the gap 48 may be narrowed to about 1 to 2 mm over the entire periphery. Furthermore, in order to prevent surface contact between the protection liner 47 and the inner wall of the manifold 5, minute projections may be installed on the outer peripheral surface of the protection liner 47 near the respective engaging recesses 52.

The gas supply pipe 19g of the second purge gas supplier communicates with the second purge gas supply port located near the nozzle to supply the second purge gas 49 from the second purge gas supply port into the second purge gas flow path 27. The second purge gas 49 supplied into the second purge gas flow path 27 flows through the second purge gas flow path 27 over the entire periphery. In this operation, a gap 46 is formed between the protection plate 12 and the lid 9 on the outer circumferential side of the second purge gas flow path 27. Therefore, the second purge gas 49 flows out from the gap 46 in the horizontal direction while purging the upper surface of the lid 9 in the process of flowing through the second purge gas flow path 27.

The second purge gas 49 flowing out of the gap 46 flows along the upper surface of the lid 9 due to Coanda effect, and when the gas reaches the inner wall of the manifold 5, the gas is deflected upward along the inner wall of the manifold 5. In this operation, if the loss of momentum when the flow is deflected by the inner wall of the manifold 5 is sufficiently small, the flow path sectional areas of the gap 46 and the gap 48 may be continuous, or the flow path sectional area of the gap 48 may be slightly smaller than that of the gap 46 in some embodiments. However, when a drop in momentum flux is expected due to the aforementioned loss or the like, the gap 48 may have a wider sectional area of flow path. That is, the pressure at the upstream side is raised in the bent flow path in which the loss occurs, but the pressure is lowered at the upstream side of the flow path sectional area expanding portion, that is, a gap between a lower end of the protection liner 47 and the lid 9. Thus, although a gap is opened between the gap 46 and the gap 48, it is possible to suppress the purge gas from being excessively dissipated from the gap between the gap 46 and the gap 48 or other gases from flowing into the gap between the gap 46 and the gap 48. The deflected second purge gas 49 flows into the gap 48, and is discharged to the furnace opening while purging the inner wall of the manifold 5. The second purge gas 49 discharged to the furnace opening passes through the vent hole 5d and is exhausted from the exhaust port 26.

Next, a process (film-forming process) of forming a film on a substrate using the aforementioned processing apparatus 1 will be described. An example, in which a silicon oxide ($SiO_2$) film is formed on a wafer W by supplying dichlorosilane ($SiH_2Cl_2$: DCS) gas as precursor gas and oxygen ($O_2$) gas as reaction gas to the wafer W, will be described here. In the following descriptions, operations of the respective components included in the processing apparatus 1 are controlled by the controller 36.

(Wafer Charging and Boat Loading)

When a plurality of wafers W is charged on the boat 14 (wafer charging), the boat 14 is loaded into the process chamber 8 by the boat elevator 17 (boat loading), and the lower end of the reaction tube 2 is hermetically closed (sealed) by the lid 9. The furnace opening is closed by the lid 9 so that the protection plate 12 approaches the protection liner 47 to form the guide. In this operation, the lower end of the protection liner 47 is located below (on the lid 9 side) the upper surface of the protection plate 12, and the shortest distance between the outer circumferential end of the protection plate 12 and the lower end of the protection liner 47 is set to about 2 to 3 mm. Furthermore, $N_2$ gas is supplied as the first purge gas 28 from the first purge gas supplier to the base of the nozzles 23a to 23c through the gap 41. In addition, the $N_2$ gas is supplied as the second purge gas 49 from the second purge gas supplier to between the protection liner 47 and the manifold 5 via the second purge gas flow path 27. Furthermore, the third purge gas 29 branched from the first purge gas 28 is supplied into the inner circumferential surface of the cylindrical body 39. The supply of the first purge gas 28 and the second purge gas 49 may be continuously performed at least until the film-forming process is completed.

(Pressure Regulation and Temperature Adjustment)

The interior of the process chamber 8 is vacuum-exhausted (depressurization-exhausted) by the vacuum pump 35 so as to reach a desired pressure (degree of vacuum). The internal pressure of the process chamber 8 is measured by the pressure sensor 33. The APC valve 34 is feedback-controlled based on the measured pressure information. Furthermore, the wafers W in the process chamber 8 are heated by the heater 3 to a predetermined temperature. In this operation, a state of supplying electric power to the heater 3 is feedback-controlled based on the temperature information detected by the temperature detector 4 such that the interior of the process chamber 8 has a desired temperature distribution. In addition, the rotation of the boat 14 and the wafers W by the rotation mechanism 16 begins.

(Film-Forming Process) [Precursor Gas Supply Step]

When the internal temperature of the process chamber 8 is stabilized at a predetermined processing temperature, DCS gas is supplied to the wafers W in the process chamber 8. The flow rate of the DCS gas is controlled by the MFC 21a to become a desired flow rate, and the DCS gas is supplied into the process chamber 8 via the gas supply pipe 19a and the nozzle 23a. In this operation, $N_2$ gas is supplied from the first purge gas supplier and the second purge gas supplier to the furnace opening. Thus, the base and peripheral portions of the nozzles 23a to 23c may be intensively purged with the first purge gas 28, and other portions may be purged with the second purge gas 49 to dilute the concentration of the precursor gas in the furnace opening. In this process, the supply of the $N_2$ gas from the first purge gas supplier and the second purge gas supplier may be temporarily increased.

[Precursor Gas Exhaust Step]

Next, the supply of the DCS gas is stopped, and the interior of the process chamber 8 is vacuum-exhausted by the vacuum pump 35. In this operation, the $N_2$ gas may be supplied as inert gas from the inert gas supplier into the process chamber 8 (inert gas purge).

[Reaction Gas Supply Step]

Next, $O_2$ gas is supplied to the wafer W in the process chamber 8. The flow rate of the $O_2$ gas is controlled by the MFC 21b to become a desired flow rate, and the $O_2$ gas is supplied into the process chamber 8 via the gas supply pipe 19b and the nozzle 23b. In this operation, the $N_2$ gas is supplied from the first purge gas supplier and the second purge gas supplier to the furnace opening. Thus, the base and peripheral regions of the nozzles 23a to 23c may be intensively purged, and other portions may be purged to dilute the concentration of the reaction gas in the furnace opening.

[Reaction Gas Exhaust Step]

Next, the supply of the $O_2$ gas is stopped, and the interior of the process chamber 8 is vacuum-exhausted by the vacuum pump 35. In this operation, the $N_2$ gas may be supplied from the inert gas supplier into the process chamber 8 (inert gas purge).

A cycle which performs the aforementioned four steps can be implemented a predetermined number of times (once or more) to form a $SiO_2$ film having a predetermined composition and a predetermined thickness on the wafer W.

(Boat Unloading and Wafer Discharging)

After a film having a predetermined thickness is formed, the $N_2$ gas is supplied from the inert gas supplier, so that the interior of the process chamber 8 is substituted by the $N_2$ gas, and the internal pressure of the process chamber 8 is returned to an atmospheric pressure. Thereafter, the lid 9 is moved down by the boat elevator 17 and the boat 14 is unloaded from the reaction tube 2 (boat unloading). Thereafter, the processed wafers W are discharged from the boat 14 (wafer discharging).

A processing condition when forming a $SiO_2$ film on the wafer W may be exemplified as an example as follows:

Processing temperature (wafer temperature): 300 to 700 degrees C.

Processing pressure (internal pressure of process chamber): 1 to 4,000 Pa

DCS gas supply flow rate: 100 to 10,000 sccm $O_2$ gas supply flow rate: 100 to 10,000 sccm $N_2$ gas supply flow rate: 100 to 10,000 sccm.

By setting the processing condition to values which fall within the respective ranges exemplified above, the film-forming process can appropriately proceed.

As described above, in the first embodiment, the guide has a division structure including the protection plate 12 (the outer circumferential portion 12b) and the protection liner 47, and the protection liner 47 is fixedly installed in the inner flange 5b of the manifold 5.

Therefore, since there is no possibility that the manifold 5 and the protection liner 47 make contact with each other when the lid 9 is opened and closed, it is possible to prevent generation of particles and damage to the protection liner 47 due to the contact between the manifold 5 and the protection liner 47.

Furthermore, even when the protection plate 12 makes contact with the protection liner 47, the clearance between the protection plate 12 and the protection liner 47 may be smaller than the conventional 4 mm because they are not immediately damaged due to only pushing-up of the protection liner 47.

The protection plate 12 and protection liner 47 are separately provided in a separate structure. Since the lower end of the protection liner 47 is located closer to the lid 9 than the upper surface of the protection plate 12, a large part of the gas flow in the gap 46 could be conducted to the gap 49, that is, the gap 46 and the gap 49 are coupled fluidically while decoupled physically. Thus, it is possible to sufficiently secure the flow rate and flow velocity of the second purge gas 49 flowing through the gap 48, and to effectively purge the inner wall of the manifold 5. Therefore, the adhesion of reaction byproduct to the inner wall of the manifold 5 and the generation of particles can be remarkably suppressed, thereby improving productivity.

In addition, since the supply amount of the second purge gas 49 can be suppressed, it is not necessary to increase the total flow rate of the purge gas more than necessary amount. Thus, it is possible to suppress the adverse effect of the purge gas on the wafer processing and to improve the film-formation quality.

Moreover, in the first embodiment, the inner flange 5b is formed in the inner wall portion of the manifold 5 located near the cooling channel 25. Since the inner flange 5b is close to the central portion in the furnace, the inner flange 5b becomes high temperature and the inner wall of the manifold 5 located near the inner flange 5b also becomes high temperature. That is, a large temperature gradient is generated between the inner flange 5b and the cooling channel 25. Therefore, the inner wall portion of the manifold 5 is configured to be closer to, for example, the inner flange 5b, so as to more facilitate heat conduction to the inner flange 5b than the cooling channel 25. Accordingly, the inner flange 5b is sufficiently heated, and heat transferred from the inner flange 5b can raise the inner wall temperature of the manifold 5, thereby suppressing the adhesion of reaction byproduct to the inner wall of the manifold 5.

Furthermore, the notch 51 is installed at a position corresponding to a member, which is installed to penetrate the sidewall of the manifold 5 of the protection liner 47, such as the temperature detector 4 or the like, and the engaging recess 52 is installed at a position corresponding to the engaging portion 54c of the protection liner 47. Therefore, positioning of the protection liner 47 in the peripheral direction is facilitated, and the protection liner 47 can be efficiently installed.

In addition, when the protection liner 47 is installed by the protection liner fixtures 54 made of an elastic material and installed at at least three points, the protection liner fixtures 54 are configured to press the protection liner 47 radially outward. Therefore, since the position of the protection liner 47 in the radial direction is determined by the balance of the pressing force of the protection liner fixtures 54, fine alignment is not necessary and the protection liner 47 can be efficiently installed.

While the embodiment of the present disclosure has been specifically described above, the present disclosure is not limited to the aforementioned embodiment but may be variously modified without departing from the scope of the present disclosure.

Figure 6:
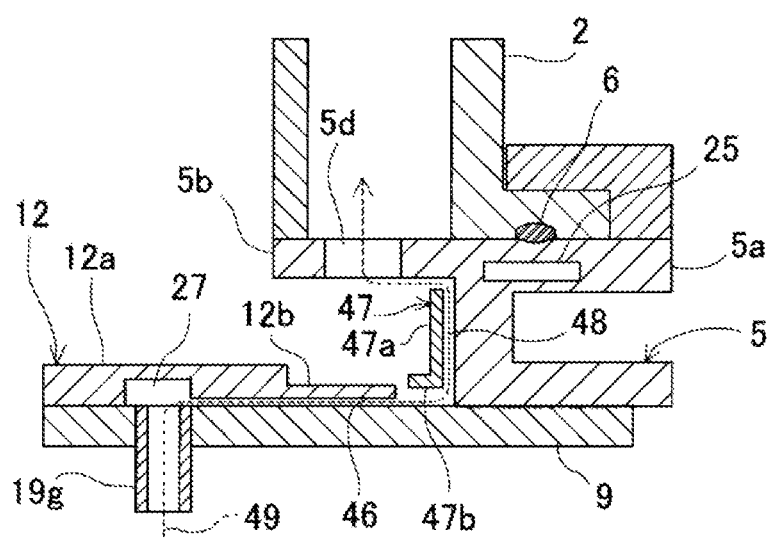
FIG. 6 is a vertical cross sectional view of a guide and peripheral portions illustrating a first modification of the first embodiment.

FIG. 6 illustrates a first modification of the guide. In the first modification, the protection liner 47 is configured by a vertical guide 47a and a horizontal guide 47b.

The vertical guide 47a is installed to face the inner wall of the manifold 5 so that a width of about 1 to 2 mm is formed between the vertical guide 47a and the inner wall of the manifold 5. Furthermore, the horizontal guide 47b extends and protrudes radially inward from the lower end of the vertical guide 47a. When the furnace opening is closed by the lid 9, the horizontal guide 47b faces the outer circumferential surface of the protection plate 12 and the lower end of the horizontal guide 47b is located below the upper surface of the protection plate 12.

In the first modification, it is configured so that the second purge gas 49 flowing out of the gap 46 flows into the gap between the horizontal guide 47b and the lid 9, and is then deflected upward along the inner wall of the manifold 5 and flows into the gap 48.

Therefore, the second purge gas 49 staying when deflected upward does not leak into the furnace opening, and can efficiently purge the inner wall of the manifold 5.

Figure 7:
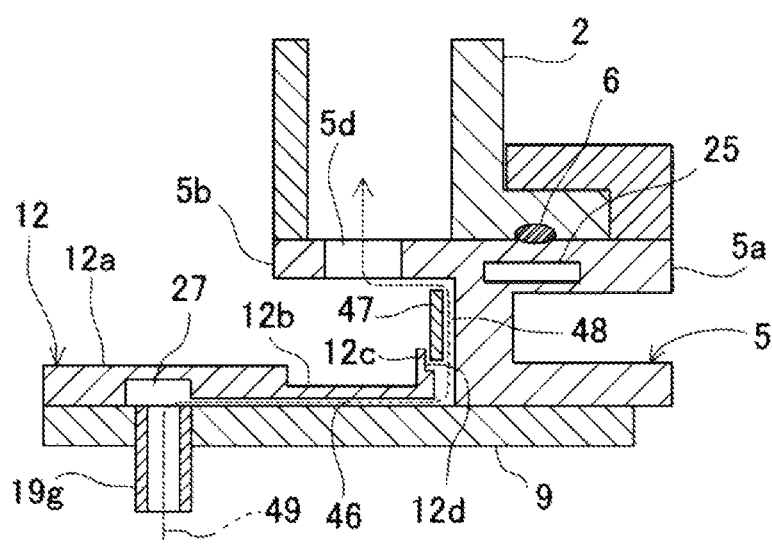
FIG. 7 is a vertical cross sectional view of a guide and peripheral portions illustrating a second modification of the first embodiment.

FIG. 7 illustrates a second modification of the guide. In the second modification, the protection plate 12 is configured by a central portion 12a, an outer circumferential portion 12b, and a guide 12c.

The guide 12c extends and protrudes vertically upward from the outer circumferential end of the outer circumferential portion 12b. In addition, a notch portion 12d is formed in the outer circumferential surface of the guide 12c over the entire periphery. When the furnace opening is closed by the lid 9, the lower portion of the protection liner 47 is accommodated in the notch portion 12d. Furthermore, in this operation, the lower end of the protection liner 47 is located below the upper end of the guide 12c.

In the second modification, it is configured so that the second purge gas 49 flowing through the gap 46 is deflected upward between the outer circumferential surface of the guide 12c and the inner wall of the manifold 5, and then flows into the gap 48.

Therefore, the second purge gas 49 staying when deflected upward does not leak into the furnace opening, and can efficiently purge the inner wall of the manifold 5.

Figure 8:
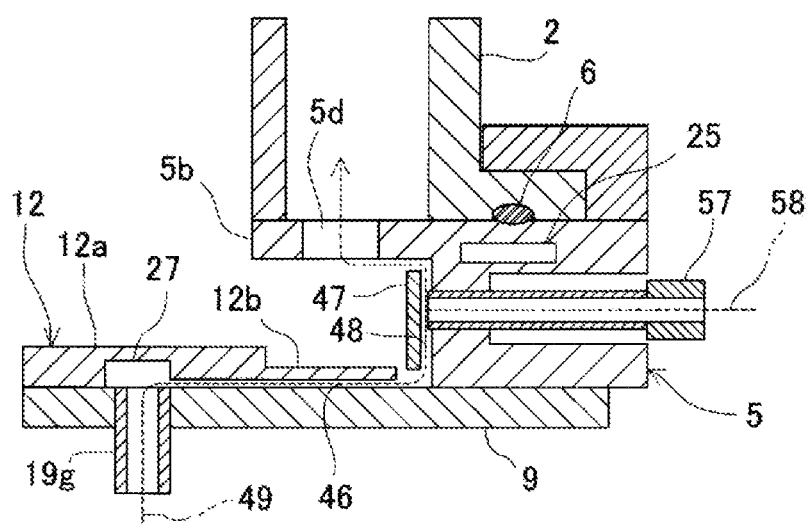
FIG. 8 is a vertical cross sectional view of a guide and peripheral portions illustrating a third modification of the first embodiment.
Figure 9:
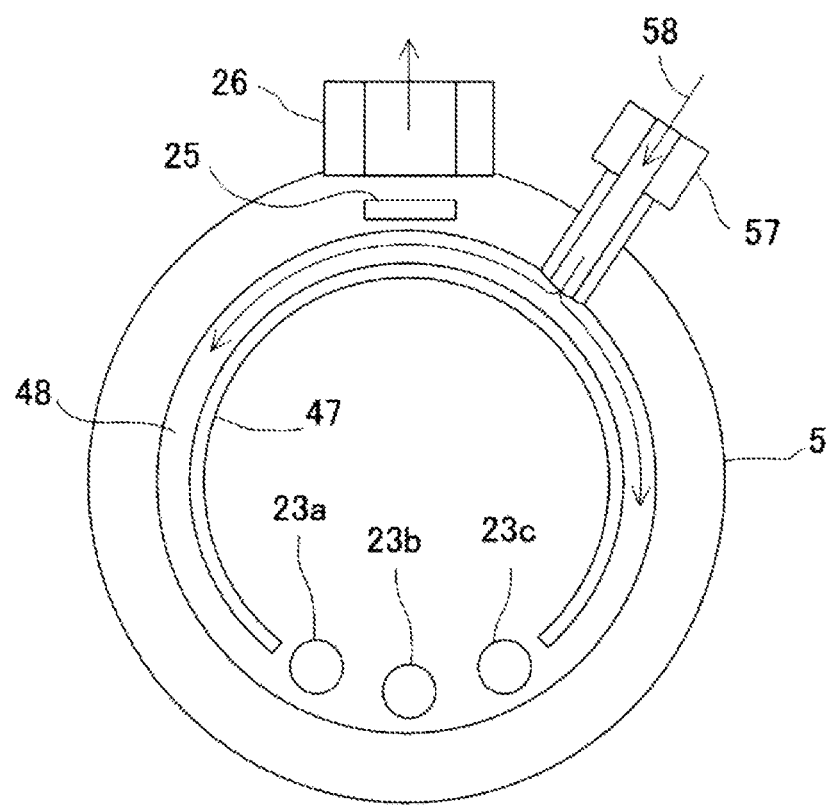
FIG. 9 is a cross sectional plane view illustrating a furnace opening according to the third modification.

Next, a third modification of the present disclosure will be described with reference to FIGS. 8 and 9. The components in FIGS. 6 and 7, the same as those in FIGS. 1 and 3, are denoted by the same reference numerals and a description thereof will be omitted.

In the third modification, an auxiliary second purge gas supply pipe 57, which penetrates the sidewall of the manifold 5 in the radial direction and is opened in the gap 48, is further installed. The auxiliary second purge gas supply pipe 57 injects $N_2$ gas as an auxiliary second purge gas 58 into the gap 48.

The auxiliary second purge gas 58 supplied into the gap 48 circumferentially diffuses along the outer circumferential surface of the protection liner 47 and flows out from the upper end of the protection liner 47. Alternatively, the protection liner 47 injects the gas from a portion in which the protection liner 47 is notched toward the nozzles 23a, 23b and 23c.

In the third modification, it is configured so that the auxiliary second purge gas 58 is separately supplied to the gap 48. Therefore, since the flow rate of the purge gas flowing through the gap 48 can be increased, it is possible to more effectively purge the inner wall of the manifold 5, and to further suppress the adhesion of reaction byproduct to the inner wall of the manifold 5 and the generation of particles.

Furthermore, since the auxiliary second purge gas 58 is supplied from the notched portion of the protection liner 47 to the base and circumferential portions of the nozzles 23a to 23c, the processing gas concentration in the base and circumferential portions of the nozzles 23a to 23c can be reduced, thereby suppressing the adhesion of reaction byproduct. Thus, it is possible to suppress the generation of particles and to improve the productivity.

It is also to be understood that the configuration of the third modification is applicable to the modification of the first embodiment illustrated in FIGS. 6 and 7.

Moreover, in the first embodiment and modifications of the first embodiment, it is configured so that the reaction tube 2 has the outer tube (reaction tube 2) and the inner tube (inner walls of the supply buffer chamber 2A and the exhaust buffer chamber 2B), in which the outer tube is supported by the outer flange 5a and the inner tube is supported by the inner flange 5b. On the other hand, the configuration of the present disclosure may also be applied to a processing apparatus which does not have an inner tube or in which an inner tube is integrated with an outer tube (by the inner flange made of quartz). Even in that case, the inner flange 5b made of metal coupled to the manifold 5 can be formed in order to raise the temperature of the inner wall of the manifold 5.

Furthermore, in the first embodiment and the third modification, the protection liner 47 is configured to have a C-shaped cross section in which portions having the nozzles 23a to 23c installed are cut. On the other hand, the protection liner 47 may have a cylindrical shape. In this case, the notches 51 are formed at positions corresponding to the nozzles 23a to 23c such that the protection liner 47 and the nozzles 23a to 23c do not make contact with each other. Alternatively, the protection liner 47 may have a notch 51 formed at a position corresponding to at least one of the nozzles 23a to 23c, and may be C-shaped by cutting portions corresponding to other nozzles.

Furthermore, in the first embodiment and the third modification, the protection liner 47 is formed of one member, but the protection liner 47 may have a division structure including two or more members. In this case, the respective members of the protection liner 47 are fixed at three or more points by the protection liner fixtures 54.

Moreover, in the first embodiment and the third modification described above, there has been described an example in which DCS gas is used as the precursor gas. However, the present disclosure is not limited to the aforementioned embodiment. For example, as the precursor gas, it may be possible to use, in addition to the DCS gas, an inorganic halosilane precursor gas such as hexachlorodisilane ($Si_2Cl_6$: HCDS) gas, monochlorosilane ($SiH_3Cl$: MCS) gas or trichlorosilane ($SiHCl_3$: TCS) gas, halogen-group-free amino-based (amine-based) silane precursor gas such as tris-dimethylaminosilane ($Si[N(CH_3)_2]3H$: 3DMAS) gas or bis-tert-butylaminosilane ($SiH_2[NH(C_4H_9)]_2$: BTBAS) gas, or halogen-group-free inorganic silane precursor gas such as monosilane ($SiH_4$: MS) gas or disilane ($Si_2H_6$: DS) gas.

Furthermore, in the aforementioned embodiment, there has been described an example in which a $SiO_2$ film is formed. However, the present disclosure is not limited to the aforementioned embodiment. For example, in addition to these, a SiN film, a SiON film, a SiOCN film, a SiOC film, a SiCN film, a SiBN film, a SiBCN film or the like may be formed by using nitrogen (N)-containing gas (nitriding gas) such as ammonia ($NH_3$) gas, carbon (C)-containing gas such as propylene ($C_3H_6$) gas, boron (B)-containing gas such as boron trichloride ($BCl_3$), or the like.

Furthermore, the present disclosure may be suitably applied to a case where a film containing a metal element such as titanium (Ti), zirconium (Zr), hafnium (Hf), tantalum (Ta), niobium (Nb), aluminum (Al), molybdenum (Mo), tungsten (W) or the like, i.e., a metal-based film, is formed on the wafer W.

Furthermore, in the aforementioned embodiment, there has been described an example which a film is deposited on the wafer W. However, the present disclosure is not limited to the aforementioned embodiment. For example, it is to be understood that the present disclosure may be suitably applied to a case where a process such as an oxidation process, a diffusion process, an annealing process, and an etching process or the like is performed on a wafer W or a film formed on the wafer W.

In the substrate processing apparatus, a notch is formed at an upper end of the protection liner to avoid at least one of the plurality of nozzles.

According to embodiments of the present disclosure, it is possible to exert excellent effects that can significantly suppress adhesion of reaction byproduct to an inner wall of a manifold, significantly suppress generation of particles, and improve productivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the scope of the disclosures. The accompanying claims and their equivalents are intended to cover such forms or modifications as would fall within the scope of the present disclosure.

What is claimed is:

1. A substrate processing apparatus, comprising:
a process chamber having a cylindrical space configured to accommodate a substrate; and
a plurality of nozzles, each of which communicating with a gas supply pipe and discharging processing gas in the process chamber,
wherein the process chamber includes:
a cylindrical reaction tube having an open end;
a cylindrical manifold connected to the open end of the reaction tube and having a side surface that is configured to introduce the processing gas from the gas supply pipe into the process chamber; and
a lid configured to open and close an opening at an end of the manifold, which is opposite to another end of the manifold that is connected to the reaction tube,
wherein the lid includes:
a protection plate installed on an inner surface of the lid such that a first gap is formed between the lid and the protection plate; and
an introduction hole configured to introduce purge gas from an outer side of the lid into the first gap, and
wherein the manifold includes a protection liner on an inner face of the side surface such that a second gap is formed between the manifold and the protection liner, the first gap and second gap are decoupled physically, coupled fluidically and allow the purge gas flowing from the first gap to be deflected by the inner face of the manifold and to flow into the second gap.

2. The apparatus according to claim 1, wherein the protection liner has a cylindrical or substantially cylindrical shape, the protection plate has a disc shape having a diameter smaller than an inner diameter of the protection liner, and when the lid is closed, an end of the protection liner near the lid is closer to the lid than an surface of the protection plate disposed on an opposite side of the lid.

3. The apparatus according to claim 1, wherein the protection liner is configured to be fixed at at least three points by a fixture made of an elastic material.

4. The apparatus according to claim 1, a notch is formed at an upper end of the protection liner to avoid at least one of the plurality of nozzles.

5. The apparatus according to claim 1,
wherein the process chamber further includes:
a seal member configured to seal a connection part between the reaction tube and the manifold; and
an inner tube substantially concentrically disposed inside the reaction tube,
wherein the manifold includes:
an outer flange making contact with the reaction tube through the seal member;
an inner flange configured to support the inner tube; and
a cooling channel formed in the outer flange, and
wherein the cooling channel is positioned such that a temperature of the seal member becomes a predetermined temperature or lower, and heat transferred from the inner flange raises a temperature of the inner face of the manifold.

6. The apparatus according to claim 5, wherein the inner flange has a relatively small thickness at a connection point with the inner face of the manifold.

7. The apparatus according to claim 5, wherein the outer flange has a smaller thickness or a larger thermal resistance than the side surface of the manifold.

8. The apparatus according to claim 1, wherein flow path sectional areas of the first gap and the second gap are substantially continuous at a transition portion of the first gap and the second gap.

9. The apparatus according to claim 5, wherein the manifold is made of metal, and the protection plate and the protection liner are made of quartz.

10. The apparatus according to claim 5, wherein the reaction tube has an exhaust port laterally formed adjacent to the open end, and configured to discharge the processing gas and the purge gas.

11. The apparatus according to claim 1, wherein the reaction tube is configured to retain a plurality of substrates in a way that the plurality of substrates are arranged at predetermined intervals along a predetermined axis.

12. A method of manufacturing a semiconductor device, the method comprising:
- preparing the substrate processing apparatus according to claim 1;
- loading a substrate to the substrate processing apparatus;
- processing the substrate by the substrate processing apparatus; and
- unloading the substrate from the substrate processing apparatus,
- wherein in the act of processing the substrate, a predetermined amount of purge gas that does not affect film-formation is continuously supplied from a first purge gas supplier and a second purge gas supplier.

\* \* \* \* \*